United States Patent [19]

Beisswenger et al.

[11] 4,393,295

[45] Jul. 12, 1983

[54] APPARATUS AND METHOD FOR ENGRAVING WITH AN ELECTRON BEAM

[75] Inventors: Siegfried Beisswenger; Wolfgang Boppel, both of Preetz; Dieter Grieger, Kiel, all of Fed. Rep. of Germany

[73] Assignee: Ing. Rudolf Hell GmbH, Fed. Rep. of Germany

[21] Appl. No.: 240,869

[22] Filed: Mar. 5, 1981

[30] Foreign Application Priority Data

Nov. 24, 1979 [DE] Fed. Rep. of Germany ....... 2947444

[51] Int. Cl.³ .............................................. B23K 15/00
[52] U.S. Cl. ...................... 219/121 EJ; 219/121 EK; 219/121 EA; 219/121 ES
[58] Field of Search .................... 219/121 EJ, 121 EK, 219/121 EA, 121 ER, 121 ES

[56] References Cited

U.S. PATENT DOCUMENTS

| 3,246,079 | 4/1966 | Teucher | 219/121 EA X |
| 3,340,601 | 9/1967 | Gariotti | 219/121 EJ X |
| 3,404,254 | 10/1968 | Jones | 219/121 EJ |
| 4,028,523 | 6/1977 | Anderl et al. | 219/121 EK |

*Primary Examiner*—C. L. Albritton
*Attorney, Agent, or Firm*—Hill, Van Santen, Steadman, Chiara & Simpson

[57] ABSTRACT

Apparatus and method for engraving with an electron beam such that depressions of different sizes can be generated in the surface of a workpiece and the different sizes of depressions are produced by an electron beam and wherein during periods when depressions are not to be formed the electron beam remains on but is defocused so that it does not form depressions. A modification of the invention provides that at times when the beam is not being used to cut depressions that it is pulsed wherein the short pulses of the beam which engage the work surface do not do any cutting.

6 Claims, 1 Drawing Figure

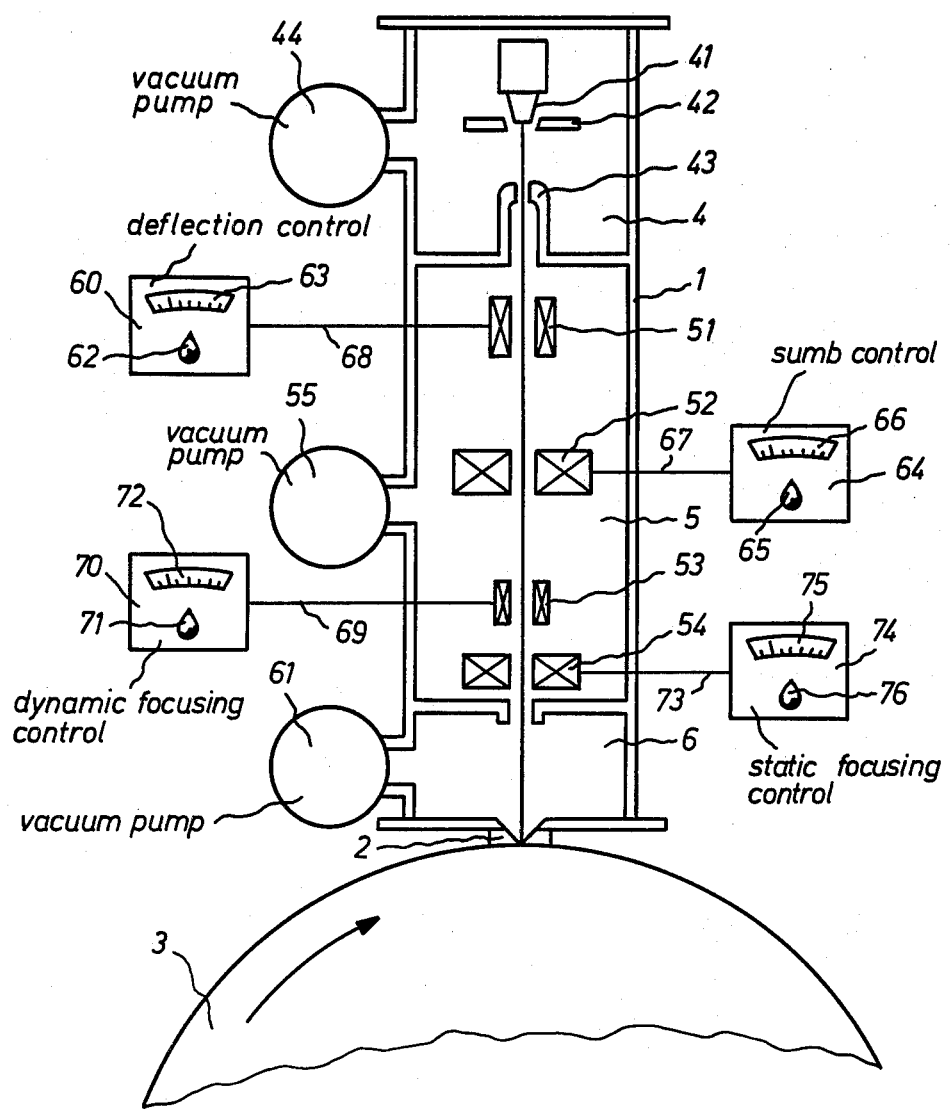

APPARATUS AND METHOD FOR ENGRAVING WITH AN ELECTRON BEAM

BACKGROUND OF THE INVENTION

1. Field of the Invention

The invention relates in general to engraving with an electron beam wherein depressions or pits of different sizes are formed in the surface of a workpiece with an electron beam and in which the pits or depressions of different sizes are generated by changing the electron beam.

2. Description of the Prior Art

U.S. Pat. No. 4,028,523 discloses an engraving method and device for implementing the method in which cut-shaped depressions or pits are formed in the surface of a workpiece which could be a gravure or cylinder for the manufacture of a gravure printing form. The size of the cups or pits which are generated is determined by the time of incidence of the electron beam on the surface of the workpiece such that shorter incidence makes smaller pits and longer incidence make larger pits. In this system, the electron beam does not strike the surface of the workpiece in those time periods in which no processing or cutting is desired, but the beam is laterally deflected into a sump at a suitable location within the beam generator. This occurs with the use of an additional deflection arrangement which may be electrostatic or electromagnetic in operation so as to obtain a blanking effect. The variation in the size of the cups or pits determines the cup volume which is a measure of the amount of ink to be transferred by the form during the printing process can also be caused by varying the intensity of the beam. Alternatively, the duration time of the beam on the cutting surface can be varied to vary the size of the cup or alternatively, the focusing of the beam can be adjusted so as to vary the size of the cup. In U.S. Pat. No. 4,028,523 the focusing is controlled such that during the on time of the electron beam the focal plane of the beam lies closer to the surface for small cups than it does for large cups.

The engraving systems of the prior art, however, have not in practice proved practical even though they theoretically allow significantly higher work speeds due to the inertia-free control of the electron beam but conventional engraving methods such as electromagnetically driven engraving tools or traditional etching methods have generally been utilized.

One of the reasons for this is that the electron beam engraving at the beginning and during pauses in the engraving results which noticeably effect the cup geometry such as the shape and volume of the cups particularly at high speed in high frequency cutting. In other words, with a short engraving time for each cup and using high beam intensity incorrect cups result particularly at the beginning of the engraving or even at later touchup engraving such that the entire form becomes unusable.

When the electron beam is switched on or when it is again switched on after being off and during the continuing deflection for blanking between the engraving of the individual cups, a positive space charge is built up within the volume of the beam generator during the ionization of the residual gas and the positive space charge has an unfavorable influence on the static focusing of the electron beam so as to make it uncontrollable. Until a static state has occurred, a certain time passes during which the cup deformities mentioned above occur, but this cannot be accepted for the manufacture of fault-free printing forms.

Previously this effect did not have a negative influence in material processing with electron beams and in electron beam welding devices. In the manufacture of forms for printing press technology, however, the finest and most accurate structures must be produced at very high speed so this effect becomes noticeable and renders the method unusable since the eye when observing a printed product can easily detect errors which were caused by fault-free forms resulting from incorrectly engraved cups.

SUMMARY OF THE INVENTION

It is an object of the present invention to avoid the disadvantages of the prior art and to provide a new and improved method and apparatus for rapid successive generations of cups, pits or depressions in the surface of a workpiece particularly of a gravure form.

In the invention, pits of different sizes are generated with an electron beam wherein during periods when cutting is not to occur at times beteen the generation of individual depressions, the electron beam remains on and is defocused on the workpiece such that no cutting occurs.

Another method encompassed in the invention is that during times when cutting is not to occur, the electron beam is pulsed such that the pulse duration is so short that no cutting occurs.

Another feature of the invention is that the pulse control of the electron beam occurs with a deflection circuit.

Other objects, features and advantages of the invention will be apparent from the following description and claims when read in view of the drawings in which:

BRIEF DESCRIPTION OF THE DRAWING

The FIGURE schematically illustrates an electron beam generating system of the invention.

DESCRIPTION OF THE PREFERRED EMBODIMENTS

The FIGURE illustrates an electron beam generating system which in many respects is similar to that disclosed in U.S. Pat. No. 4,028,523, FIG. 3 and the description of such patent is hereby incorporated by refernce.

The electron beam generating system 1 is supported above a rotating gravure cylinder 3 and a sliding special seal 2 between the beam generating system 1 and the gravure seal 3 may be of the type described in U.K. application Ser. No. 20 23 336 or U.K. application Ser. No. 20 27 271.

The electron beam generating system 1 has three chambers with the upper chamber 4 being the beam generator, the middle chamber being the beam shaping chamber 5 and the lower chamber being the processing chamber 6. The beam generator 4 contains a glow cathode 41 which produces an electron beam shown in solid line extending from the glow cathode 41 where it passes through a Wehnelt cylinder 42 and an anode 43. A vacuum pump 44 is connected to the beam generator chamber 4.

The beam passes in the beam shaping chamber 5 through a deflection arrangement 51 which is connected to a suitable control 60 which has a knob 62 and an indicator 63 for varying the voltage on the deflection arrangement 51 through an input lead 68. A beam sump 52 is connected by a lead 67 to a beam sump control 64 which has a control knob 65 and an indicator 66 for varying the voltage on the beam sump 52. During pauses between the engraving of individual cups, the beam can be deflected by the deflection unit 51 from the center of the electron beam generating system and, thus, from the surface of the workpiece which is to be processed. This deflection arrangement with a beam interceptor which represents the so-called "blanking system" can also be designed as described in U.S. Pat. No. 4,028,523, but the system is operated in a different manner.

In one embodiment of the invention, the electron beam is not suppressed, in other words, deflected so that it does not engage the workpiece during the period between the engraving of two successive cups but rather it is pulsed onto the surface of the workpiece during engraving pauses by means of the blanking system so that new space charges are not built-up in the course of the beam path. With a sufficiently high frequency repetition of individual pulses and with a selection of the pulse duration such that no cutting occurs the ionization state within the beam generator and particularly in the area which determines the focusing remains unaltered so that no undesirable effects result.

A dynamic focus coil 53 is mounted in chamber 5 and the beam passes therethrough and is connected by a lead 69 to a dynamic focusing control 70 which has a control knob 71 and an indicator 72. A static focusing coil 54 is mounted so that the beam passes therethrough and it is connected by a lead 73 to a static focusing control 74 which has a knob 76 and an indicator 75. The focusing of the beam with dynamic focus coil 53 and static focus coil 54 is similar to that described with respect to such elements in U.S. Pat. No. 4,028,523.

The beam proceeds from the beam shaping chamber 5 into the processing chamber 6 and impinges on the cylinder 3. Both chambers 5 and 6 are connected to suitable vacuum pumps 55 and 61 as shown.

In a second embodiment of the invention, the electron beam is not deflected from the surface of the printing cylinder during the engraving pauses between cups but it remains on the surface and is defocused. Such defocusing occurs to such a degree that no cutting occurs during the defocusing time. The energy transferred to the surface of the rotating printing cylinder 3 is absorbed by the cylinder and diverted without any cutting occurring. The permanent projection of the electron beam to the surface of the printing form 3 results in the ionization state within the electron beam generator system remaining constant such that no space charge will be built up and thus there will be no undesirable transients occurring when cutting is to be resumed as in prior art systems.

In a further development of the invention the static and dynamic focusing coils 53 and 54 can be designed as disclosed in U.K. application 20 12 476. This results in allowing significantly lower control output for the dynamic focus coil and results in a shorter design of the overall electron beam generating system due to the special coil design.

The use of separate vacuum pumps 44, 55 and 61 to the beam generating chamber 4, the beam shaping chamber 5 and the processing chamber 6 allows one to work with the graduated vacuum within the individual chambers to meet the requirements of the chambers and the individual stages if need be can be separated from each other without having to re-evacuate the overall system.

The operation of the individual electrodes and the controls are known to those skilled in the art and are discussed in U.S. Pat. No. 4,028,523 which is hereby incorporated by reference. Specifically for the use of the electron beam engraving and printing technology it should also be pointed out that the dynamic focusing lens determines the tint value which depends on the size of the cup. With small volume cups short focus pauses are emitted and for large volume cups long focus pulses are utilized and these are equivalent to a current control range varying from 0.5 through approximately 1 ampere in the dynamic focusing coil 53. The dynamic lens receives no current during the defocusing periods in the engraving periods between cutting. The beam diameter on the surface of the drum 3 is at about 100 $\mu$m during engraving and is about 400 $\mu$m during defocusing. The defocusing is satisfactory so as to avoid a cutting effect during the engraving pauses because of the good dissipation of the copper surface of the standard copper printing cylinder 3.

The present invention is not limited to the manufacture of printing gravure cylinders but it can also be used for the manufacture of fine structures which require extreme precision such as, for example, in the manufacture of semiconductor components in the perforation of superfine foils and in all applications where an electron beam generating systems are used for cutting and the undesirable effects described under disadvantages of the prior art result.

Although the invention has been described with respect to preferred embodments, it is not to be so limited as changes and modifications can be made which are within the full intended scope of the invention as defined by the appended claims.

We claim as our invention:

1. An electron beam engraving method for the fast, successive generation of depressions of different sizes in the surface of a workpiece, whereby the different depressions are generated by means of the different influence of the electron beam, comprising the steps of directing the beam on the workpiece, and defocusing said beam on the workpiece in the periods between the generation of the individual depressions while maintaining the electron beam on the workpiece during said periods between the generation of depressions such that cutting does not occur.

2. An electron beam engraving method for the fast, successive generation of depressions of different sizes in the surface of a workpiece, whereby the different depressions are generated by means of a different influence of the electron beam, comprising the steps of directing the beams on the workpiece, and pulsing said beam on the workpiece in the periods between the generation of the depressions, and the duration of said pulses is so short that no cutting of the workpiece occurs.

3. The method according to claim 2, wherein the control of the electron beam to cause it to pulse is accomplished by means of a deflection circuit.

4. The method according to claim 1 wherein the defocusing of the beam is accomplished with a focusing coil and an electronic control connected to said focusing coil.

5. Apparatus for forming depressions in a workpiece comprising means for generating an electron beam for projecting a focused beam on said workpiece, means for intermittently focusing and defocusing said beam on the workpiece at high speed and high frequency with the beam focused when forming depressions and with the beam defocused in periods between generation of the individual depressions and maintaining an electron beam on the workpiece during said periods between the generation of depressions and said defocusing is to a degree such that cutting does not occur.

6. Apparatus for forming depressions in a workpiece comprising means for generating a focused beam on said workpiece to cut depressions at high speed, and means for intermittently pulsing said beam at high speed and high frequency during the periods between generation of depressions and pulsing is to a degree that no cutting of the workpiece occurs.

* * * * *

UNITED STATES PATENT AND TRADEMARK OFFICE
CERTIFICATE OF CORRECTION

PATENT NO. : 4,393,295
DATED : July 12, 1983
INVENTOR(S) : Beisswenger et al

It is certified that error appears in the above—identified patent and that said Letters Patent is hereby corrected as shown below:

Please delete on the front page of the patent

30 Foreign Application Priority Data
November 24, 1979 DE Fed. Rep. of Germany 2947444

Signed and Sealed this

Third Day of November, 1987

Attest:

DONALD J. QUIGG

Attesting Officer

Commissioner of Patents and Trademarks